United States Patent
Yu (10) Patent No.: US 11,183,656 B2
(45) Date of Patent: Nov. 23, 2021

(54) ORGANIC ELECTROLUMINESCENT DEVICE, DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Tiancheng Yu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/689,708

(22) Filed: Nov. 20, 2019

(65) Prior Publication Data
US 2020/0235327 A1    Jul. 23, 2020

(30) Foreign Application Priority Data
Jan. 22, 2019  (CN) .......................... 201910058757.9

(51) Int. Cl.
*H01L 51/50* (2006.01)
*H01L 27/32* (2006.01)
*H01L 51/00* (2006.01)

(52) U.S. Cl.
CPC ........ *H01L 51/506* (2013.01); *H01L 27/3211* (2013.01); *H01L 51/5004* (2013.01);
(Continued)

(58) Field of Classification Search
CPC ............... H01L 51/506; H01L 51/5004; H01L 27/3211; H01L 51/001; H01L 51/008;
(Continued)

(56) References Cited

U.S. PATENT DOCUMENTS

2005/0048314 A1*  3/2005  Antoniadis ........... H01L 51/506
                                                          428/690
2006/0194960 A1*  8/2006  Kim ......................... A61P 9/00
                                                          540/1
(Continued)

FOREIGN PATENT DOCUMENTS

CN            1422104 A     6/2003
CN          103915477 A     7/2014
(Continued)

OTHER PUBLICATIONS

'Influence of n-type versus p-type AlGaN electron-blocking layer on InGaN/GaN multiple quantum wells light-emitting diodes', Yun Ji et al., Applied Physics Letters 103, p. 053512-1-053512-5, 2013. (Year: 2013).*

(Continued)

*Primary Examiner* — Charles D Garber
*Assistant Examiner* — S M Sohel Imtiaz
(74) *Attorney, Agent, or Firm* — Nath, Goldberg & Meyer; Joshua B. Goldberg (57) ABSTRACT

The present disclosure provides an organic electroluminescent device, a display substrate including the organic electroluminescent device, and a display apparatus including the display substrate. The organic electroluminescent device includes an anode, a cathode, and a light emitting layer between the anode and the cathode, wherein a hole transport layer is provided between the anode and the light emitting layer and includes a hole transport material and a P-type doping material, electrons of the highest occupied molecular orbit of the P-type doping material are excitable to the lowest unoccupied molecular orbit of the P-type doping material under the excitation of light to cause an electron transfer reaction from the highest occupied molecular orbit (Continued)

of the hole transport material to the highest occupied molecular orbit of the P-type doping material.

11 Claims, 5 Drawing Sheets

(52) U.S. Cl.
CPC .......... *H01L 51/001* (2013.01); *H01L 51/002* (2013.01); *H01L 51/0004* (2013.01); *H01L 51/0005* (2013.01); *H01L 51/008* (2013.01); *H01L 51/0077* (2013.01); *H01L 2251/552* (2013.01)

(58) Field of Classification Search
CPC ............... H01L 51/0004; H01L 51/002; H01L 2251/552; H01L 51/0077; H01L 51/0005; H01L 51/0078; H01L 51/0051
See application file for complete search history.

(56) References Cited

U.S. PATENT DOCUMENTS

| | | | | |
|---|---|---|---|---|
| 2009/0200923 | A1* | 8/2009 | Fujita | H01L 51/5012 313/504 |
| 2010/0283046 | A1* | 11/2010 | Uchida | B82Y 20/00 257/40 |
| 2011/0233525 | A1* | 9/2011 | Terao | H01L 51/5088 257/40 |
| 2012/0003790 | A1* | 1/2012 | Brown | H01L 51/0007 438/99 |
| 2012/0235131 | A1* | 9/2012 | Okamoto | H05B 33/10 257/40 |
| 2012/0267619 | A1* | 10/2012 | Yamada | H01L 51/506 257/40 |
| 2013/0270531 | A1* | 10/2013 | Seo | H01L 51/5206 257/40 |
| 2014/0217379 | A1* | 8/2014 | Humphries | H01L 51/0039 257/40 |
| 2015/0249115 | A1* | 9/2015 | Chen | H01L 51/56 257/40 |
| 2016/0233449 | A1* | 8/2016 | Murayama | C09K 11/883 |
| 2016/0248030 | A1* | 8/2016 | Zhang | H01L 51/506 |
| 2016/0268351 | A1* | 9/2016 | Wu | H01L 27/3211 |
| 2016/0365389 | A1* | 12/2016 | Gao | H01L 51/5016 |
| 2017/0117480 | A1* | 4/2017 | Oh | H01L 51/0058 |
| 2018/0033996 | A1* | 2/2018 | Wang | H01L 51/5206 |
| 2018/0269416 | A1* | 9/2018 | Hamade | G06K 9/2018 |
| 2018/0287084 | A1* | 10/2018 | Park | H01L 51/5206 |
| 2019/0097155 | A1* | 3/2019 | Kim | H01L 51/5016 |
| 2020/0102419 | A1* | 4/2020 | Sano | H01B 1/128 |
| 2020/0111960 | A1* | 4/2020 | Li | C09K 11/06 |

FOREIGN PATENT DOCUMENTS

| | | |
|---|---|---|
| CN | 104241540 A | 12/2014 |
| CN | 104409650 A | 3/2015 |
| CN | 106549113 A | 3/2017 |
| CN | 106783932 A | 5/2017 |
| CN | 109742251 A | 5/2019 |
| EP | 3190639 A1 | 7/2017 |

OTHER PUBLICATIONS

"Extinction coefficient for red-shifted chlorophylls: Chlorophylld and chlorophyllf", Yaqiong Li, Biochimica et Biophysica Acta, pp. 1292-1298, 2012. (Year: 2012).*

"Fundamentals of Atmospheric Radiation: An Introduction with 400 Problems", Craig Bohren, ISBN: 978-3-527-40503-9, Feb. 2006 (Year: 2006).*

First Office Action dated Sep. 25, 2020 for corresponding Chinese application 201910058757.9.

* cited by examiner

ORGANIC ELECTROLUMINESCENT DEVICE, DISPLAY SUBSTRATE AND DISPLAY APPARATUS

CROSS-REFERENCE TO RELATED APPLICATIONS

This application claims priority from Chinese patent application No. 201910058757.9, filed on Jan. 22, 2019, the contents of which are incorporated herein by reference in their entirety.

TECHNICAL FIELD

The disclosure relates to the technical field of display technology, and particularly relates to an organic electroluminescent device, a display substrate and a display apparatus.

BACKGROUND

At present, organic electroluminescent display (OLED) devices have gradually become the mainstream in the display field due to their excellent performances such as low power consumption, high color saturation, wide viewing angle, thin thickness, and flexibility.

However, the conventional OLED device has low efficiency, requires a high driving voltage, and has high power consumption.

SUMMARY

Embodiments of the present disclosure provide an organic electroluminescent device, including an anode, a cathode, and a light emitting layer between the anode and the cathode, wherein a hole transport layer is provided between the anode and the light emitting layer and includes a hole transport material and a P-type doping material, electrons of the highest occupied molecular orbit of the P-type doping material are excitable to the lowest unoccupied molecular orbit of the P-type doping material under the excitation of light to cause an electron transfer reaction from the highest occupied molecular orbit of the hole transport material to the highest occupied molecular orbit of the P-type doping material to occur.

In some implementations, the electrons of the highest occupied molecular orbit of the P-type doping material are excitable to the lowest unoccupied molecular orbit of the P-type doping material under the excitation of light with a wavelength ranging from 380 nm to 780 nm.

In some implementations, the electrons of the highest occupied molecular orbit of the P-type doping material are excitable to the lowest unoccupied molecular orbit of the P-type doping material under the excitation of light emitted from the light emitting layer.

In some implementations, a molar absorption coefficient of the P-type doping material ranges from $10^4$ $L \cdot mol^{-1} \cdot cm^{-1}$ to $10^5$ $L \cdot mol^{-1} \cdot cm^{-1}$.

In some implementations, the P-type doping material includes at least one of fluoroboron dipyrrole and chlorophyll.

In some implementations, a mass of the P-type doping material in the hole transport layer is 0.01% to 1% of a total mass of the hole transport layer.

In some implementations, a difference between an energy level of the highest occupied molecular orbit of the P-type doping material and an energy level of the highest occupied molecular orbit of the hole transport material is less than or equal to 0.3 eV.

Embodiments of the present disclosure provide an organic electroluminescent display substrate, including the organic electroluminescent device described above.

In some implementations, the organic electroluminescent display substrate includes a red sub-pixel, a green sub-pixel and a blue sub-pixel, each of the red sub-pixel, the green sub-pixel and the blue sub-pixel corresponds to one organic electroluminescent device, and color of light emitted from the light-emitting layer in the organic electroluminescent device is consistent with the color of the sub-pixel, the P-type doping materials of the hole transport layers in the organic electroluminescent devices corresponding to the blue sub-pixel and the red sub-pixel are chlorophyll, and the P-type doping material of the hole transport layer in the organic electroluminescent device corresponding to the green sub-pixel is fluoroboron dipyrrole.

Embodiments of the present disclosure provide an organic electroluminescent display apparatus, including the organic electroluminescent display substrate described above.

Embodiments of the present disclosure further provide a manufacturing method of an organic electroluminescent device, including: forming an anode, a cathode, and a light emitting layer provided between the anode and the cathode; and forming a hole transport layer between the anode and the light emitting layer by using a hole transport material and a P-type doping material, wherein electrons of the highest occupied molecular orbit of the P-type doping material are capable of being excited to the lowest unoccupied molecular orbit of the P-type doping material under the excitation of light, and an electron transfer reaction occurs from the highest occupied molecular orbit of the hole transport material to the highest occupied molecular orbit of the P-type doping material.

In some implementations, forming a hole transport layer between the anode and the light emitting layer using a hole transport material and a P-type doping material includes: respectively placing the P-type doping material and the hole transport material in two thermal evaporation metal sources; respectively controlling evaporation rates of the P-type doping material and the hole transport material by respectively controlling temperatures of the two thermal evaporation metal sources; and performing a thermal evaporation process on the P-type doping material and the hole transport material in a vacuum environment to realize blending of the P-type doping material and the hole transport material, and forming the hole transport layer by adopting the blended hole transport material and P-type doping material through a vacuum coating process.

In some implementations, forming a hole transport layer between the anode and the light emitting layer by using a hole transport material and a P-type doping material includes: blending the P-type doping material and the hole transport material in a predetermined mass ratio; dissolving the blended P-type doping material and hole transport material in a predetermined solvent to form a solution; and forming the hole transport layer by adopting the solution of the blended P-type doping material and hole transport material through a wet film forming process.

In some implementations, the wet film forming process includes inkjet printing, screen printing or blade coating.

DETAILED DESCRIPTION

In order to enable a person skilled in the art to better understand the present disclosure, technical solutions of the present disclosure will be described in further detail below with reference to the attached drawings and the specific embodiments.

Figure 1:
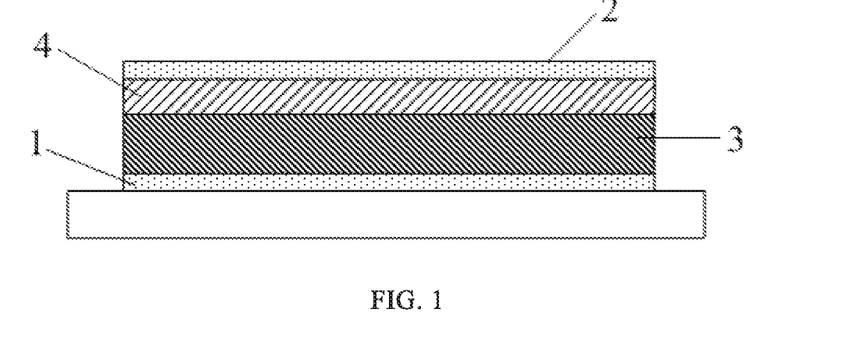
FIG. 1 is a schematic structural view of an organic electroluminescent device according to an embodiment of the disclosure.

An embodiment of the present disclosure provides an organic electroluminescent device, as shown in FIG. 1, the organic electroluminescent device includes a first electrode 1, a second electrode 2, and a light emitting layer 3 disposed between the first electrode 1 and the second electrode 2, wherein a hole transport layer 4 is disposed between the second electrode 2 and the light emitting layer 3, the hole transport layer 4 includes a hole transport material and a P-type doping material, and electrons of a Highest Occupied Molecular Orbit (HOMO) of the P-type doping material can be excited to a Lowest Unoccupied Molecular Orbit (LUMO) of the P-type doping material under the excitation of light, so that an electron transfer reaction occurs from the Highest Occupied Molecular Orbit (HOMO) of the hole transport material to the Highest Occupied Molecular Orbit (HOMO) of the P-type doping material, and hole carriers are injected into the hole transport material by the P-type doping material.

In the OLED device of the present embodiment, the P-type doping material of the hole transport layer 4 does not need to have a deep LUMO energy level, but an electron transfer reaction may occur in the P-type doping material under the excitation of light, that is, the electrons of the HOMO of the P-type doping material can be excited to the LUMO of the P-type doping material under the excitation of light. Here, the light for exciting the P-type doping material is not limited, and the light for exciting the P-type doping material may be sunlight, or may be infrared light, ultraviolet light, or visible light (having a wavelength ranging from 380 nm to 780 nm) emitted from another light source. After the P-type doping material is subjected to the electron transfer reaction under the excitation of light, the HOMO of the P-type doping material is in a half-full state, and at this time, the electron transfer reaction may occur from the full HOMO of the hole transport material to the half-full HOMO of the P-type doping material, and the hole injection barrier is broken, so that hole carriers are injected into the hole transport layer 4, contact resistance with the second electrode can be effectively reduced, the hole injection is improved, the driving voltage of the OLED device is reduced, the efficiency of the OLED device is increased, and the power consumption of the OLED device is reduced.

In the present embodiment, the second electrode 2 is an anode.

Figure 2:
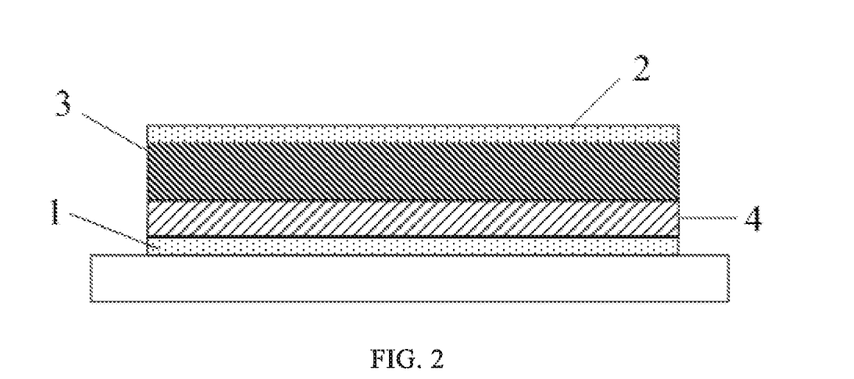
FIG. 2 is a schematic structural view of an organic electroluminescent device according to an embodiment of the disclosure.

An embodiment of the present disclosure further provides an organic electroluminescent device, as shown in FIG. 2, which includes a first electrode 1, a second electrode 2, and a light-emitting layer 3 disposed between the first electrode 1 and the second electrode 2, wherein a hole transport layer 4 is disposed between the first electrode 1 and the light-emitting layer 3, the hole transport layer 4 includes a hole transport material and a P-type doping material, and electrons of a Highest Occupied Molecular Orbit (HOMO) of the P-type doping material can be excited to a Lowest Unoccupied Molecular Orbit (LUMO) of the P-type doping material under the excitation of light, so that an electron transfer reaction occurs from the Highest Occupied Molecular Orbit (HOMO) of the hole transport material to the Highest Occupied Molecular Orbit (HOMO) of the P-type doping material, and injection of hole carriers into the hole transport material by the P-type doping material is realized.

In the OLED device of the present embodiment, the P-type doping material of the hole transport layer (HTL) 4 does not need to have a deep LUMO energy level, but the electron transfer reaction may occur in the P-type doping material under the excitation of light, that is, electrons of the HOMO of the P-type doping material may be excited to the LUMO of the P-type doping material under the excitation of light. Here, the light for exciting the P-type doping material is not limited, and the light for exciting the P-type doping material may be sunlight, or may be infrared light, ultraviolet light, or visible light (having a wavelength ranging from 380 nm to 780 nm) emitted from another light source. After the P-type doping material is subjected to the electron transfer reaction under the excitation of light, the HOMO of the P-type doping material is in a half-full state, and at this time, the electron transfer reaction may occur from the full HOMO of the hole transport material to the half-full HOMO of the P-type doping material, and the hole injection barrier is broken, so that the hole carriers are injected into the hole transport layer 4, contact resistance with the first electrode can be effectively reduced, the hole injection is improved, the driving voltage of the OLED device is reduced, the efficiency of the OLED device is increased, and the power consumption of the OLED device is reduced.

In this embodiment, the first electrode 1 is an anode.

It should be noted that, in each of the OLED devices of the above embodiments, an electron blocking layer may be provided between the hole transport layer 4 and the light emitting layer 3. In addition, in the embodiment in which the first electrode 1 is a cathode and the second electrode 2 is the anode, a hole blocking layer, an electron transport layer, and an electron injection layer may be further provided between the light emitting layer 3 and the first electrode (i.e., cathode) 1. In the embodiment in which the first electrode 1 is the anode and the second electrode 2 is a cathode, a hole blocking layer, an electron transport layer, and an electron injection layer may be further provided between the light emitting layer 3 and the second electrode (i.e., cathode) 2.

In some implementations, the electron transfer reaction may occur in the P-type doping material under the excitation of light emitted from the light emitting layer (EML) 3.

Figure 3:
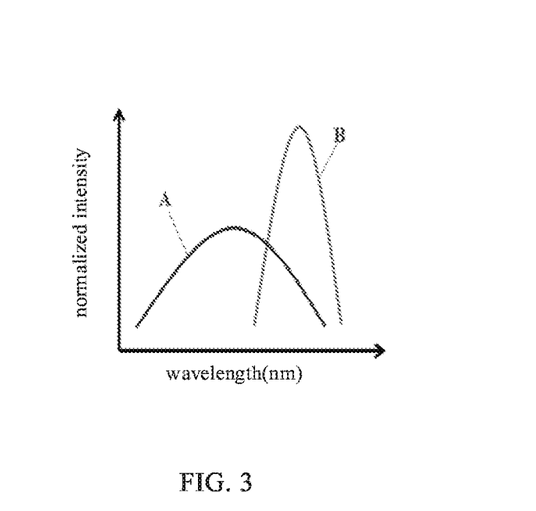
FIG. 3 is a graph illustrating an absorption spectrum of a P-type doping material and a light emission spectrum of a light emitting layer according to an embodiment of the disclosure.

As shown in FIG. 3, the curve A in FIG. 3 is an absorption spectrum of the P-type doping material, the curve B is an emission spectrum of the light emitting layer 3, and a wavelength range of the absorption spectrum of the P-type doping material is overlapped with the wavelength range of the emission spectrum of the light-emitting layer 3, so that the P-type doping material in the hole transport layer 4 can be excited by light to cause the electron transfer reaction at a very low brightness of the light emitting layer 3 at an initial stage of lighting the OLED device, thereby breaking the hole injection barrier and realizing a massive injection of the hole carriers.

In order to further ensure that the light excites the P-type doping material to generate the electron transfer reaction, in some implementations, a molar absorption coefficient of the P-type doping material ranges from $10^4$ L·mol$^{-1}$·cm$^{-1}$ to $10^5$ L·mol$^{-1}$·cm$^{-1}$.

That is to say, the hole transport layer 4 is made of a P-type doping material with a high molar absorption coefficient, facilitating the electron transfer reaction to occur in the P-type doping material under the excitation of weak light initially emitted from the light emitting layer 3 at the initial stage of lighting the OLED device, so that the hole injection barrier is broken, and the injection of hole carriers is promoted, thereby the contact resistance with the electrode is reduced and the power consumption of the OLED device is reduced.

In some implementations, a difference between an energy level of the HOMO of the P-type doping material and an energy level of the HOMO of the hole transport material is less than or equal to 0.3 eV.

Figure 4:
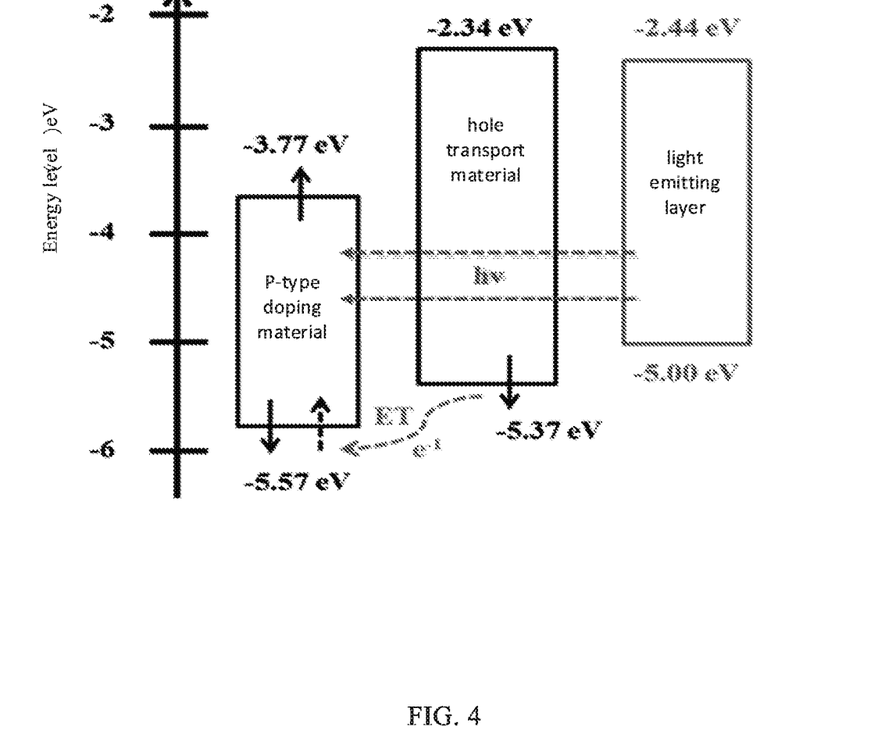
FIG. 4 is diagram illustrating energy levels of a P-type doping material, a hole transport material, and a light emitting layer according to an embodiment of the disclosure.

As shown in FIG. 4, the electrons of the Highest Occupied Molecular Orbital (HOMO) of the P-type doping material may be excited to the Lowest Unoccupied Molecular Orbital (LUMO) of the P-type doping material under the excitation of light (i.e., photons having energy E=hv) emitted from the light emitting layer, so that the electron transfer (ET) reaction occurs from the Highest Occupied Molecular Orbital (HOMO) of the hole transporting material to the Highest Occupied Molecular Orbital (HOMO) of the P-type doping material, and the above difference between the energy level of the HOMO of the P-type doping material and the energy level of the HOMO of the hole transport material is more advantageous in promoting energy level transition.

In some implementations, the P-type doping material is chlorophyll.

Figure 5:
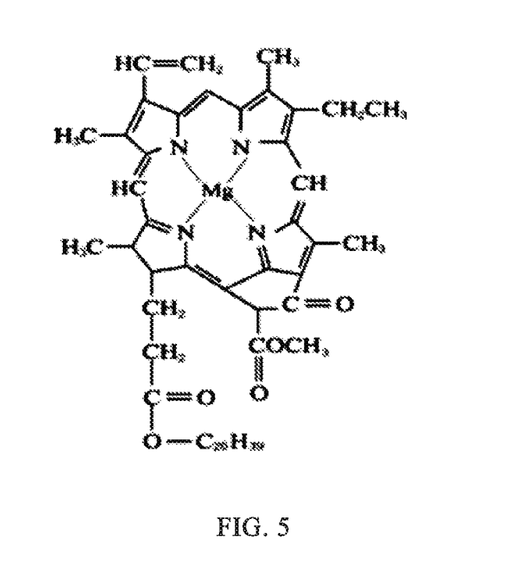
FIG. 5 is a molecular structural formula of chlorophyll.
Figure 6:
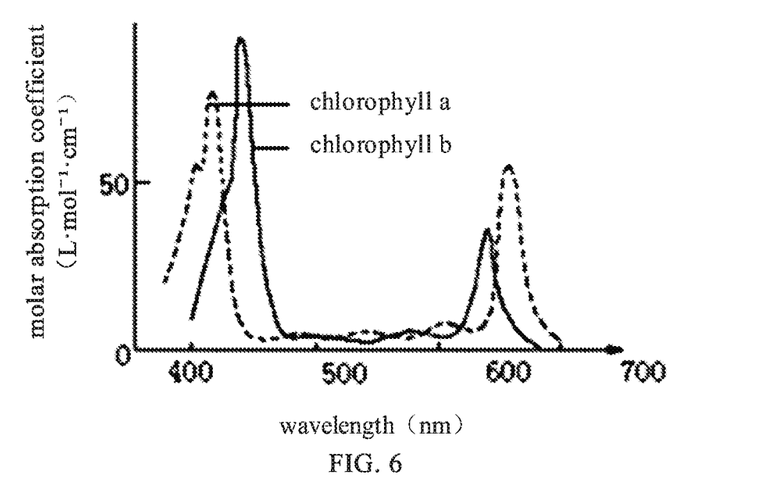
FIG. 6 is a graph illustrating an absorption spectrum of chlorophyll.

The molecular structural formula of chlorophyll is shown in FIG. 5, and the chlorophyll has extremely high molar absorption coefficient in blue and red light bands in the visible light range, and the P-type doping material based on the chlorophyll structural unit is suitable for an OLED device in the blue or red light band. As shown in FIG. 6, the absorption spectrum of the P-type doping material of chlorophyll is greatly overlapped with the emission spectrums of the blue OLED device and the red OLED device, and the blue OLED device or the red OLED device may emit light to induce the electron transfer reaction in the P-type doping material of chlorophyll in the hole transport layer 4 of its own to occur, so that P-type doping of the HTL material in the blue OLED device or the red OLED device can be realized, and the driving voltage and power consumption of the blue OLED device or the red OLED device can be reduced.

In some implementations, the P-type doping material is fluoroboron dipyrrole.

Figure 7:
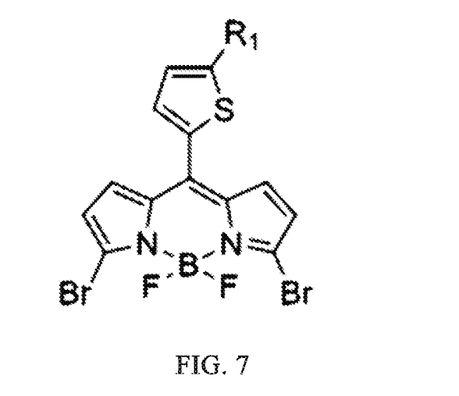
FIG. 7 is a molecular structural formula of fluoroboron dipyrrole.
Figure 8:
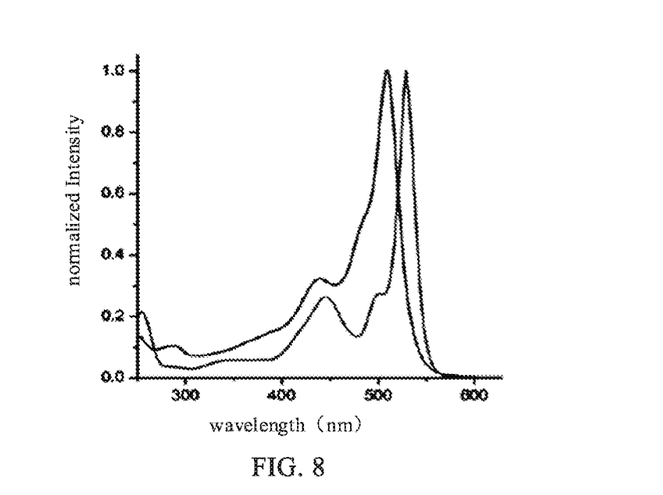
FIG. 8 is a graph illustrating an absorption spectrum of fluoroboron dipyrrole.

The molecular structural formula of the fluoroboron dipyrrole is shown in FIG. 7, the fluoroboron dipyrrole has an extremely high molar absorption coefficient in a green light band, and the P-type doping material (HOMO=−5.4 eV, LUMO=−3.6 eV) is suitable for an OLED device in a single green light band. As shown in FIG. 8, the absorption spectrum of the P-type doping material of the fluoroboron dipyrrole is greatly overlapped with the light emission spectrum of the green OLED device, and the green OLED device may emit light to induce the electron transfer reaction in the P-type doping material of fluoroboron dipyrrole in the hole transport layer 4 of its own to occur, so that P-type doping of the HTL material in the green OLED device can be realized, and the driving voltage and power consumption of the green OLED device can be reduced.

It should be noted that the doping amount of the P-type doping material with high molar absorption coefficient used in the embodiments of the present disclosure is not required to be too high, because too high doping amount of the P-type doping material may affect light emission of the light emitting layer 3.

In some implementations, a mass of the P-type doping material in the hole transport layer 4 is 0.01% to 1% of a total mass of the hole transport layer 4. That is, the P-type doping material accounting for 0.01% to 1% of the total mass of the hole transport layer 4 can realize the electron transfer reaction under the excitation of light.

Sizes, thicknesses, and the like of the respective structural layers shown in the drawings corresponding to the respective embodiments of the present disclosure are merely illustrative. In the process implementations, orthographic projection areas of the structural layers on a base substrate can be the same or different, and the structural layers required can be formed through an etching process. Meanwhile, the structures shown in the drawings do not limit geometric shapes of the structural layers, for example, the rectangles shown in the drawings can also be trapezoids or other shapes formed by etching.

Figure 9:
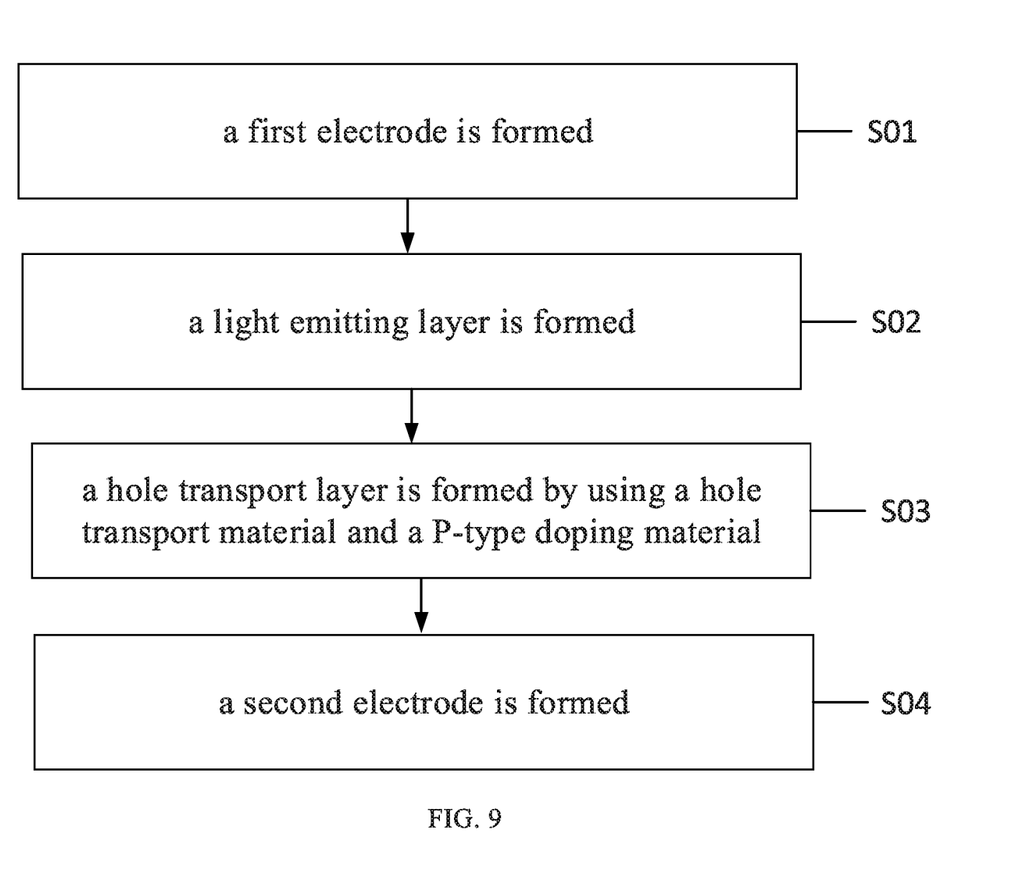
FIG. 9 is a flowchart of a manufacturing method of an organic electroluminescent device according to an embodiment of the present disclosure.

Embodiments of the present disclosure also provide a manufacturing method of an organic electroluminescent device, including the following steps S01 to S04, as shown in FIG. 9.

In step S01, a first electrode is formed.

The first electrode is a cathode, and the cathode may be formed by one or more of magnesium-silver mixture, Indium Zinc Oxide (IZO), Indium Tin Oxide (ITO), aluminum-doped zinc oxide (AZO), and the like.

In some implementations, the manufacturing method may further include a step of forming a pixel defining structure, and a material of the pixel defining structure may be selected from resin, polyimide, organosilicon, or silicon dioxide. The pixel defining structure may define a plurality of pixel units.

In step S02, a light emitting layer is formed.

Specifically, the light emitting layer may be formed by a vacuum coating process or an inkjet printing process.

In step S03, a hole transport layer is formed by using a hole transport material and a P-type doping material, electrons of a Highest Occupied Molecular Orbit (HOMO) of the P-type doping material can be excited to a Lowest Unoccupied Molecular Orbit (LUMO) of the P-type doping material under the excitation of light, so that an electron transfer reaction occurs from the Highest Occupied Molecular Orbit (HOMO) of the hole transport material to the Highest Occupied Molecular Orbit (HOMO) of the P-type doping material, and injection of hole carriers into the hole transport material by the P-type doping material is realized.

A mass of the P-type doping material may be 0.01%-1% of a total mass of the hole transport material and the P-type doping material.

In some implementations, the hole transport layer may be formed by using a vacuum coating process.

Specifically, the P-type doping material and the hole transport material may be respectively placed in two thermal evaporation metal sources, evaporation rates of the P-type doping material and the hole transport material are respectively controlled by respectively controlling temperatures of the two thermal evaporation metal sources, the thermal evaporation is performed in a vacuum environment to realize blending of the P-type doping material and the hole transport material, and the hole transport layer is formed by adopting the blended hole transport material and P-type doping material through a vacuum coating process.

In some implementations, the hole transport layer may be formed by using a wet film forming process.

Specifically, the P-type doping material and the hole transport material may be blended in a certain mass ratio (e.g., 1:99) first, and then the blended P-type doping material and hole transport material is dissolved in a suitable solvent (e.g., aromatic solvent, such as toluene, chlorobenzene or trichloromethane) to form a solution, so that the hole transport layer may be formed by using the solution of the blended P-type doping material and hole transport material through a wet film forming process such as inkjet printing, screen printing, blade coating, and the like.

In step S04, a second electrode is formed.

The second electrode is an anode, and the material forming the anode may be one of Al, Ag and Mg or alloy thereof.

Figure 10:
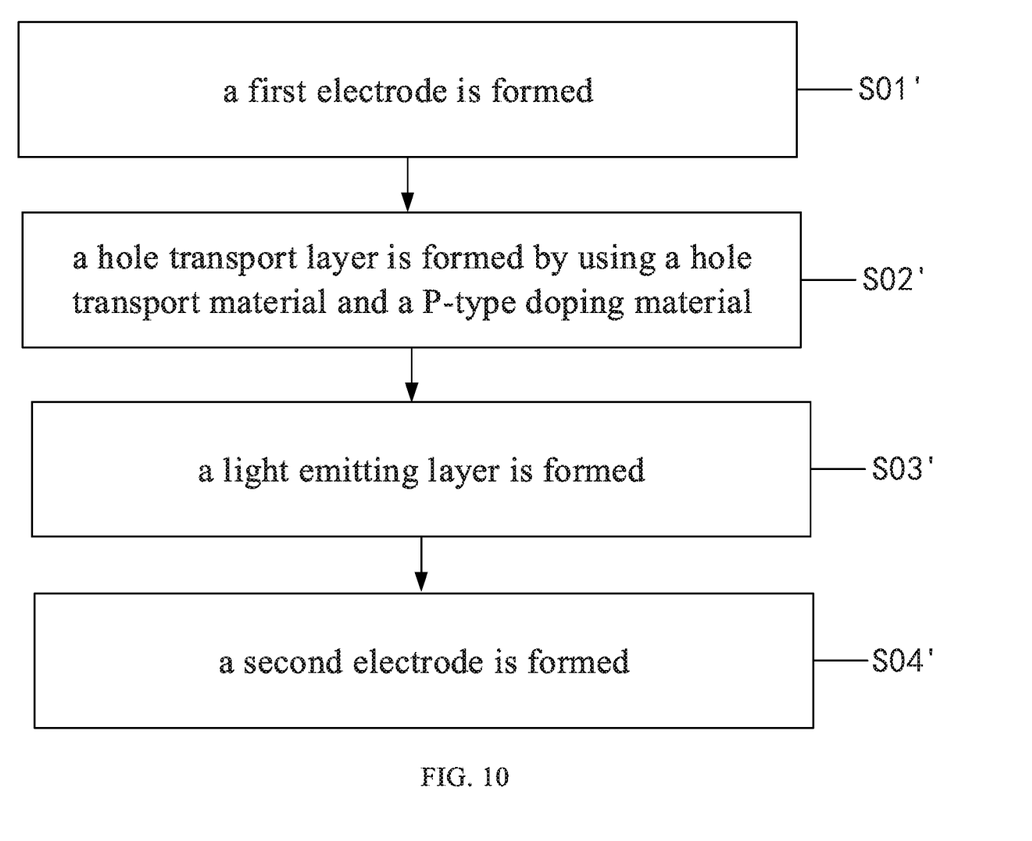
FIG. 10 is a flowchart of a manufacturing method of an organic electroluminescent device according to an embodiment of the present disclosure.

Embodiments of the present disclosure also provide a manufacturing method of an organic electroluminescent device, including the following manufacturing steps S01' to S04', as shown in FIG. 10.

In step S01', a first electrode is formed.

The first electrode is an anode, and the material forming the anode may be one of Al, Ag and Mg or alloy thereof.

In some implementations, the manufacturing method may further include a step of forming a pixel defining structure, and a material of the pixel defining structure may be selected from resin, polyimide, organosilicon, or silicon dioxide. The pixel defining structure may define a plurality of pixel units.

In step S02', a hole transport layer is formed by using a hole transport material and a P-type doping material, and electrons of a Highest Occupied Molecular Orbit (HOMO) of the P-type doping material can be excited to a Lowest Unoccupied Molecular Orbit (LUMO) of the P-type doping material under the excitation of light, so that an electron transfer reaction occurs from the Highest Occupied Molecular Orbit (HOMO) of the hole transport material to the Highest Occupied Molecular Orbit (HOMO) of the P-type doping material, and injection of hole carriers into the hole transport material by the P-type doping material is realized.

A mass of the P-type doping material may be 0.01%-1% of a total mass of the hole transport material and the P-type doping material.

In some implementations, the hole transport layer may be formed by using a vacuum coating process.

Specifically, the P-type doping material and the hole transport material may be respectively placed in two thermal evaporation metal sources, evaporation rates of the P-type doping material and the hole transport material are respectively controlled by respectively controlling temperatures of the two thermal evaporation metal sources, the thermal evaporation is performed in a vacuum environment to realize blending of the P-type doping material and the hole transport material, and the hole transport layer is formed by adopting the blended hole transport material and P-type doping material through a vacuum coating process.

In some implementations, the hole transport layer may be formed by using a wet film forming process.

Specifically, the P-type doping material and the hole transport material may be blended in a certain mass ratio (e.g., 1:99) first, and then the blended P-type doping material and hole transport material is dissolved in a suitable solvent (e.g., aromatic solvent, such as toluene, chlorobenzene or trichloromethane) to form a solution, so that the hole transport layer may be formed by using the solution of the blended P-type doping material and hole transport material through a wet film forming process such as inkjet printing, screen printing, blade coating, and the like.

In step S03', a light emitting layer is formed.

Specifically, the light emitting layer may be formed by a vacuum coating process or an inkjet printing process.

In step S04', a second electrode is formed.

The second electrode is a cathode, and the cathode may be made of one or more of magnesium-silver mixture, Indium Zinc Oxide (IZO), Indium Tin Oxide (ITO), aluminum-doped zinc oxide (AZO), and the like.

Embodiments of the present disclosure also provide an organic electroluminescent display substrate including the organic electroluminescent device of the above embodiments.

The organic electroluminescence display substrate includes a plurality of sub-pixels with different colors, for example, red sub-pixels, green sub-pixels and blue sub-pixels, the sub-pixels correspond to OLED devices one to one, color of light emitted from the light emitting layer in the OLED device is consistent with the color of the sub-pixel corresponding to the OLED device, P-type doping materials of hole transmission layers in the OLED devices corresponding to the blue sub-pixels and the red sub-pixels are chlorophyll, and the P-type doping material of the hole transmission layer in the OLED devices corresponding to the green sub-pixels is fluoroboron dipyrrole.

The absorption spectrum of the P-type doping material of chlorophyll is greatly overlapped with the emission spectrums of the blue OLED device and the red OLED device, and the blue OLED device or the red OLED device may emit light to induce the electron transfer reaction in the P-type doping material of chlorophyll in the hole transport layer 4 of its own to occur, so that P-type doping of the HTL material in the blue OLED device or the red OLED device can be realized, and the driving voltage and power consumption of the blue OLED device or the red OLED device can be reduced.

The absorption spectrum of the P-type doping material of fluoroboron dipyrrole is greatly overlapped with the light emission spectrum of the green OLED device, and the green OLED device may emit light to induce the electron transfer reaction in the P-type doping material of fluoroboron dipyrrole in the hole transport layer 4 of its own to occur, so that P-type doping of the HTL material in the green OLED device can be realized, and the driving voltage and power consumption of the green OLED device can be reduced.

Embodiments of the present disclosure also provide a display apparatus including the organic electroluminescent display substrate. The display apparatus may be any product or component with a display function, such as electronic paper, an OLED panel, a mobile phone, a tablet computer, a television, a display, a notebook computer, a digital photo frame, a navigator and the like.

It should be understood that, the above embodiments are only exemplary embodiments for the purpose of explaining the principle of the present disclosure, and the present disclosure is not limited thereto. For one of ordinary skill in the art, various variants and modifications may be made without departing from the spirit and essence of the present disclosure. These variants and modifications also fall within the protection scope of the present disclosure.

What is claimed is:

1. An organic electroluminescent display substrate, comprising a red sub-pixel, a green sub-pixel and a blue sub-pixel, each of the red sub-pixel, the green sub-pixel and the blue sub-pixel corresponds to one organic electroluminescent device, and the organic electroluminescent device comprises an anode, a cathode, and a light emitting layer between the anode and the cathode,
the organic electroluminescent device further comprises a hole transport layer provided between the anode and the light emitting layer and comprising a hole transport material and a P-type doping material, and
electrons of the highest occupied molecular orbit of the P-type doping material are excitable to the lowest unoccupied molecular orbit of the P-type doping material under the excitation of light to cause an electron transfer reaction from the highest occupied molecular orbit of the hole transport material to the highest occupied molecular orbit of the P-type doping material to occur,
wherein light emitted from the light emitting layer in the organic electroluminescent device has a same color as the sub-pixel, the P-type doping material of the hole transport layer in the organic electroluminescent device corresponding to each of the blue sub-pixel and the red sub-pixel is chlorophyll, and the P-type doping material of the hole transport layer in the organic electroluminescent device corresponding to the green sub-pixel is fluoroboron dipyrrole.

2. The organic electroluminescent display substrate of claim 1, wherein the electrons of the highest occupied molecular orbit of the P-type doping material are excitable to the lowest unoccupied molecular orbit of the P-type doping material under the excitation of light with a wavelength ranging from 380 nm to 780 nm.

3. The organic electroluminescent display substrate of claim 1, wherein the electrons of the highest occupied molecular orbit of the P-type doping material are excitable to the lowest unoccupied molecular orbit of the P-type doping material under the excitation of light emitted from the light emitting layer.

4. The organic electroluminescent display substrate of claim 1, wherein a molar absorption coefficient of the P-type doping material ranges from $10^4$ L·mol$^{-1}$·cm$^{-1}$ to $10^5$ L·mol$^{-1}$·cm$^{-1}$.

5. The organic electroluminescent display substrate of claim 1, wherein the P-type doping material comprises at least one of fluoroboron dipyrrole and chlorophyll.

6. The organic electroluminescent display substrate of claim 1, wherein a mass of the P-type doping material in the hole transport layer is 0.01% to 1% of a total mass of the hole transport layer.

7. The organic electroluminescent display substrate of claim 1, wherein a difference between an energy level of the highest occupied molecular orbit of the P-type doping material and an energy level of the highest occupied molecular orbit of the hole transport material is less than or equal to 0.3 eV.

8. An organic electroluminescent display apparatus, comprising an organic electroluminescent display substrate which comprises a red sub-pixel, a green sub-pixel and a blue sub-pixel, each of the red sub-pixel, the green sub-pixel and the blue sub-pixel corresponds to one organic electroluminescent device, and the organic electroluminescent device comprises an anode, a cathode, and a light emitting layer between the anode and the cathode,
the organic electroluminescent device further comprises a hole transport layer provided between the anode and the light emitting layer and comprising a hole transport material and a P-type doping material, and
electrons of the highest occupied molecular orbit of the P-type doping material are excitable to the lowest unoccupied molecular orbit of the P-type doping material under the excitation of light to cause an electron transfer reaction from the highest occupied molecular orbit of the hole transport material to the highest occupied molecular orbit of the P-type doping material to occur,
wherein light emitted from the light emitting layer in the organic electroluminescent device has a same color as the sub-pixel, the P-type doping material of the hole transport layer in the organic electroluminescent device corresponding to each of the blue sub-pixel and the red sub-pixel is chlorophyll, and the P-type doping material of the hole transport layer in the organic electroluminescent device corresponding to the green sub-pixel is fluoroboron dipyrrole.

9. A manufacturing method of an organic electroluminescent device, comprising:
forming an anode, a cathode, and a light emitting layer between the anode and the cathode; and
forming a hole transport layer between the anode and the light emitting layer by using a hole transport material and a P-type doping material,
wherein electrons of the highest occupied molecular orbit of the P-type doping material are excitable to the lowest unoccupied molecular orbit of the P-type doping material under the excitation of light to cause an electron transfer reaction from the highest occupied molecular orbit of the hole transport material to the highest occupied molecular orbit of the P-type doping material to occur, wherein forming a hole transport layer between the anode and the light emitting layer using a hole transport material and a P-type doping material comprises:
respectively placing the P-type doping material and the hole transport material in two thermal evaporation metal sources;
respectively controlling evaporation rates of the P-type doping material and the hole transport material by respectively controlling temperatures of the two thermal evaporation metal sources; and
performing a thermal evaporation process on the P-type doping material and the hole transport material in a vacuum environment and blending the P-type doping material and the hole transport material to obtain a mixture, and forming the hole transport layer with the mixture through a vacuum coating process.

10. The manufacturing method of an organic electroluminescent device of claim 9, wherein forming a hole transport layer between the anode and the light emitting layer by using a hole transport material and a P-type doping material comprises:
blending the P-type doping material and the hole transport material in a predetermined mass ratio;
dissolving the mixture in a predetermined solvent to form a solution; and
forming the hole transport layer by adopting the solution through a wet film forming process.

11. The manufacturing method of an organic electroluminescent device of claim 10, wherein the wet film forming process comprises inkjet printing, screen printing or blade coating.

\* \* \* \* \*